(12) United States Patent
Dempster (10) Patent No.: US 10,190,208 B2
(45) Date of Patent: Jan. 29, 2019

(54) METHODS FOR PACKAGING A PRECURSOR MATERIAL

(71) Applicant: HzO, Inc., Draper, UT (US)

(72) Inventor: James D. Dempster, Reno, NV (US)

(73) Assignee: HZO, INC., Draper, UT (US)

( * ) Notice: Subject to any disclaimer, the term of this patent is extended or adjusted under 35 U.S.C. 154(b) by 201 days.

(21) Appl. No.: 15/150,023

(22) Filed: May 9, 2016

(65) Prior Publication Data
US 2016/0319418 A1    Nov. 3, 2016

Related U.S. Application Data

(60) Division of application No. 14/621,216, filed on Feb. 12, 2015, now Pat. No. 9,333,675, which is a continuation-in-part of application No. 13/737,737, filed on Jan. 9, 2013, now Pat. No. 9,156,055.

(60) Provisional application No. 61/585,150, filed on Jan. 10, 2012.

(51) Int. Cl.
| | |
|---|---|
| C23C 14/06 | (2006.01) |
| B29B 13/00 | (2006.01) |
| B29D 22/00 | (2006.01) |
| B05D 1/00 | (2006.01) |

(Continued)

(52) U.S. Cl.
CPC ............... *C23C 14/06* (2013.01); *B05D 1/60* (2013.01); *B29B 13/00* (2013.01); *B29D 22/003* (2013.01); *C23C 16/30* (2013.01); *B29K 2023/38* (2013.01); *Y10T 428/1352* (2015.01)

(58) Field of Classification Search
CPC ......... C23C 14/06; C23C 16/00; C23C 16/30; B29B 13/00; B29D 22/00
See application file for complete search history.

(56) References Cited

U.S. PATENT DOCUMENTS

| | | | | |
|---|---|---|---|---|
| 5,879,703 A | * | 3/1999 | Fountain | A61K 9/1271 264/4.1 |
| 2005/0260934 A1 | * | 11/2005 | Van Damme | B41N 3/034 451/49 |

(Continued)

OTHER PUBLICATIONS

ECHA brochure: "Guidance and labelling and packaging in accordance with Regulation (EC) No. 1272/2008". Jul. 2017, Version 3.0, pp. 1-200.*

(Continued)

*Primary Examiner* — Bret P Chen
(74) *Attorney, Agent, or Firm* — Kunzler P.C.

(57) ABSTRACT

Methods for obtaining a profile for a batch, or lot, of a precursor material and using the profile while processing the precursor material to form a polymer are disclosed. In such a method, a process profile that corresponds to the characteristics of a particular precursor material (e.g., the batch, etc.) may be generated. That process profile may then be used to cause a material processing system to process the precursor material in a manner that accounts for differences between that precursor material and a "standard" precursor material, while providing a polymer and, optionally, a film of "standard" quality. Apparatuses and systems that are configured to obtain profile data for a batch of precursor material, generate or modify a process profile based on the profile data and use the process profile to form a polymer are also disclosed.

14 Claims, 2 Drawing Sheets

(51) Int. Cl.
*C23C 16/30* (2006.01)
*B29K 23/00* (2006.01)

(56) References Cited

U.S. PATENT DOCUMENTS

| | | | |
|---|---|---|---|
| 2006/0291754 A1* | 12/2006 | Linton | B65D 33/2591 383/64 |
| 2007/0028564 A1* | 2/2007 | Ausnit | B65D 33/2525 53/412 |
| 2009/0198541 A1* | 8/2009 | Dolan | G06Q 10/06 705/29 |
| 2013/0228264 A1* | 9/2013 | Fitzsimmons | G06Q 10/0833 156/64 |

OTHER PUBLICATIONS

Fisher brochure, pp. 1-4, no date or citation information available.*
University of Illinois Division of Research Safety brochure, "Labeling Chemicals in Laboratories", pp. 1-2, Dec. 11, 2015.*

* cited by examiner

METHODS FOR PACKAGING A PRECURSOR MATERIAL

CROSS-REFERENCE TO RELATED APPLICATIONS

This application is a divisional of U.S. patent application Ser. No. 14/621,216, filed on Feb. 12, 2015 and titled PROFILES FOR PRECURSORS TO POLYMERIC MATERIALS ("the '216 application"), which has issued as U.S. Pat. No. 9,333,675. This application is a continuation-in-part of U.S. patent application Ser. No. 13/737,737, filed on Jan. 9, 2013 and titled PRECURSOR SUPPLIES, MATERIAL PROCESSING SYSTEMS WITH WHICH PRECURSOR SUPPLIES ARE CONFIGURED TO BE USED AND ASSOCIATED METHODS ("the '737 application"), which has issued as U.S. Pat. No. 9,156,055, in which a claim for the priority of the benefit of the Jan. 10, 2012 filing date of U.S. Provisional Patent Application 61/585,150, titled PRECURSOR SUPPLIES, MATERIAL PROCESSING SYSTEMS WITH WHICH PRECURSOR SUPPLIES ARE CONFIGURED TO BE USED AND ASSOCIATED METHODS ("the '150 Provisional Application"), has been made pursuant to 35 U.S.C. § 119(e). The entire disclosures of the '737 application and the '150 Provisional Application are hereby incorporated herein.

TECHNICAL FIELD

This disclosure relates generally to methods, systems and apparatuses for obtaining a profile for a batch, or lot, of a precursor material and using the profile while processing the precursor material to form a polymer. More specifically, this disclosure relates to methods, systems and apparatuses for generating a vaporization profile tailored to each particular batch of precursor material and for using such tailored vaporization profiles to achieve consistency in polymers from batch-to-batch.

RELATED ART

Based on the assumption that all precursor materials will have the same quality, deposition equipment is commonly tuned to repeatedly perform the same processes, with the expectation that the results of those processes (e.g., polymer quality, film quality, etc.) will be consistent. Unfortunately, the characteristics and/or quality of a precursor material (e.g., its purity, the presence of additional constituents, the extent to which additional constituents are present, etc.) may vary from one batch of precursor material to another batch of the same precursor material. Without limitation, the amounts of residual solvents (e.g., toluene, xylene, etc.) in one batch of precursor material may vary from the residual amounts of the same solvents in a different batch of precursor material. As another example, the purity, quality and/or other characteristics of precursor material from one source may differ from the respective purity, quality and/or other characteristics of the same type of precursor material from another source.

When a standard process is used to process the precursor material, i.e., to form a polymer from the precursor material and, optionally, to deposit a film that comprises the polymer, variations in the purity, quality and/or other characteristics of the precursor material may affect the quality or other characteristics of the polymer that is formed (e.g., deposited, etc.) and of any film that comprises the polymer. More specifically, when the quality of a precursor material differs from the quality of a precursor material upon which a standard process is based (i.e., the standard quality for that precursor material), the differences in quality affect the processes that are performed by the deposition equipment, which often has an effect on the characteristics and/or quality of the polymers and/or films that are formed by such processes.

In particular, the presence of solvents or other impurities in a precursor to a poly(p-xylylene) polymer (e.g., a [2.2] paracyclophane, etc.) can cause premature pressure spikes, which may result in increased pressure during pyrolysis and/or deposition. In turn, increased pressure during pyrolysis and/or deposition may have an adverse effect on the quality of a polymer and film formed as a result of the process. As an example, the application of a flawed film to a full batch of 2,000 electronic substrates having a value of $250 apiece could result in a loss of $500,000, as well as damage the reputation of the parties involved with the material deposition process (e.g., the equipment manufacturer, the party coating the substrates, etc.).

SUMMARY

This disclosure, in various aspects, relates to profiles for precursors to polymeric materials. The profile for such a precursor is considered while processing the precursor to provide a polymer and, optionally, a film of standard quality despite variations in quality between a standard precursor and the precursor that is actually processed. As used herein, the term "quality" may refer to any of a variety of different characteristics, including, without limitation, the purity of a precursor material, the presence of additional constituents in the precursor material, the extent to which additional constituents are present in the precursor material and the like. The term "constituent," as used herein, includes any residual solvents in the precursor material, other impurities or contaminants in the precursor material, additives to the precursor material and the like.

In one aspect, this disclosure relates to techniques, or methods, for obtaining a profile for a batch, or a lot, of a precursor material. Such a technique includes analyzing at least one characteristic of the precursor material. Various embodiments of such a characteristic include, without limitation, a purity of the batch of the precursor material, identification of one or more impurities in the batch of the precursor material, the amounts (e.g., proportions, percentages, etc.) of one or more impurities in the batch of the precursor material and the like.

Once one or more characteristics of the batch of the precursor material have been determined, a profile for the batch of the precursor material may be generated. The data that corresponds to such a profile may include simple numbers, such as a purity level, an identity of at least one impurity, an amount of at least one impurity or the like. Optionally, the profile may be more complex, providing a plurality of specific details about the batch of precursor material, impurities, other components and their relative amounts. In some embodiments, the profile may comprise a vaporization profile, which may account for one or more characteristics of the batch of precursor material, as well as the potential effects that various constituents of the batch of precursor material may have (e.g., on a temperature ramp, on pressure, etc.) while the batch of precursor material is heated to a vaporization temperature. The profile for the batch of the precursor material, or a representation of the profile, may be stored on a tag, which may be configured to communicate the profile to a corresponding reader of a material processing apparatus.

Once the profile for the batch of precursor material has been generated, a quantity of that batch of the precursor material may be packaged. In some embodiments, packaging of the precursor material may include introduction of the precursor material into a reservoir of a container for the precursor material, which is referred to herein as a "thermal evaporation boat" or, more simply, as a "boat." In addition, the tag may be associated with the packaged precursor material (e.g., placed within the reservoir of the boat, secured to the boat, etc.).

In another aspect, a system for preparing a batch of a precursor material for packaging is disclosed. Such a system may include a profiling element, a programming element and a packaging element. In some embodiments, a system for preparing a batch of a precursor material for packaging may also include an output element for providing a profile of the batch of the precursor material in a physical form.

The profiling element of a system for preparing a batch of a precursor material for packaging may be configured to obtain information, or data, that may be useful in generating the profile for the batch of the precursor material. In some embodiments, the profiling element may comprise a chemical analyzer of a known type. In other embodiments, the profiling element may comprise a calibration apparatus, which may comprise a small version of a material processing apparatus that recreates and allows for investigation of volatilization conditions present within a commercial material processing apparatus.

The programming element may be configured or programmed to store data corresponding to the profile for the batch of the precursor material. More specifically, the programming element may store the data on a tag. In some embodiments, the programming element may be configured to store the data on the tag electronically. In other embodiments, the programming element may generate an optically scannable element containing the data. In embodiments where the system includes an output element, the output element may convert an optically scannable element that carries the data corresponding to the profile into a physical form.

The packaging element of a system for preparing a batch of a precursor material for packaging may be configured to package a quantity of the precursor material and to associate the tag with the packaged quantity of precursor material. Without limitation, the packaging element may introduce a quantity of the precursor material into a reservoir of a boat, and associate the tag with the boat or with the quantity of precursor material within the boat.

According to another aspect, a method for processing a precursor material is disclosed. Such a method includes inserting a packaged quantity of precursor material (e.g., a boat that carries a quantity of precursor material, etc.) and a corresponding tag into a receptacle of a material processing apparatus, such as a receptacle associated with a vaporization chamber of a material deposition apparatus. With the tag in proximity to the material processing apparatus, or at least a reader thereof, the data from the tag—the profile that corresponds specifically to the packaged precursor material to which the tag corresponds—may be communicated to the material processing apparatus, or to a reader thereof. The reader may then generate a signal that carries the data to a data processing element of the material processing apparatus, and the data processing element may cause the material deposition apparatus, or a component thereof (e.g. a vaporization component of a material deposition apparatus, etc.), to process (e.g., vaporize, etc.) the precursor material in accordance with the data.

In embodiments where the material processing apparatus comprises a material deposition apparatus that is configured to vaporize the precursor material, the data may include a vaporization profile tailored to the precursor material or, more specifically, to the batch of the precursor material from which the precursor material was obtained. The vaporization profile may then be communicated to a data processing element of a material deposition apparatus, which may then vaporize the precursor material in accordance with the vaporization profile. In other embodiments, the data may include information about the precursor material to which the tag corresponds or, more specifically, the batch of the precursor material from which the corresponding precursor material was obtained. Once that information is communicated to a data processing element of a material processing apparatus, programming of the data processing element may enable the data processing element to use that information to generate process profile (e.g., a vaporization profile, etc.), which may also be referred to as a "performance profile," appropriate for the precursor material, and the data processing element may then cause the material deposition apparatus to process (e.g., vaporize, etc.) the precursor material in accordance with the process profile.

A material processing apparatus is also disclosed. As indicated previously herein, in various embodiments, the material processing apparatus may comprise a material deposition apparatus. A material processing apparatus according to this disclosure may include a receptacle for a quantity of packaged precursor material (e.g., a boat, etc.), a reader, a data processing element and a material processing component. The reader, which is associated with the receptacle for the packaged precursor material, may be configured to obtain data carried by a tag that is associated with the packaged precursor material. The data carried by the tag corresponds to the precursor material or, more specifically, to a batch of precursor material from which the precursor material was obtained.

The reader may also be configured to communicate the data from the tag to a data processing element of the material processing apparatus. In some embodiments, the reader may generate a signal that carries the data.

Upon receiving the signal from the reader, the data processing element may, under control of one or more programs, process the data. Processing of the data may include obtaining from the signal a process profile (e.g., a vaporization profile, etc.) for the precursor material. Alternatively, the data processing element may process data from the signal and use that data to generate a process profile for the precursor material. In some embodiments, the process profile may be generated based on a standard process profile for a standard precursor material (i.e., for a precursor material of standard purity, for a precursor material with a standard amount of one or more impurities, for a precursor material with a standard amount of one or more solvents, etc.). In other embodiments, the data processing element may generate the process profile by inputting the data into an algorithm.

With a process profile that corresponds to the packaged precursor material, or, more specifically, to the batch from which the precursor material was obtained, the data processing element may use the process profile to control one or more aspects of a material processing component of the material deposition apparatus. Without limitation, the data processing element may control a temperature (e.g., a temperature ramp, a process temperature (e.g., vaporization temperature, etc.), etc.) and/or a pressure at which the precursor material is processed (e.g., vaporized, etc.).

Other aspects, as well as various features and advantages of the disclosed subject matter will become apparent to those of ordinary skill in the art through consideration of the ensuing disclosure, the appended claims and the accompanying drawings.

DETAILED DESCRIPTION

Figure 1:
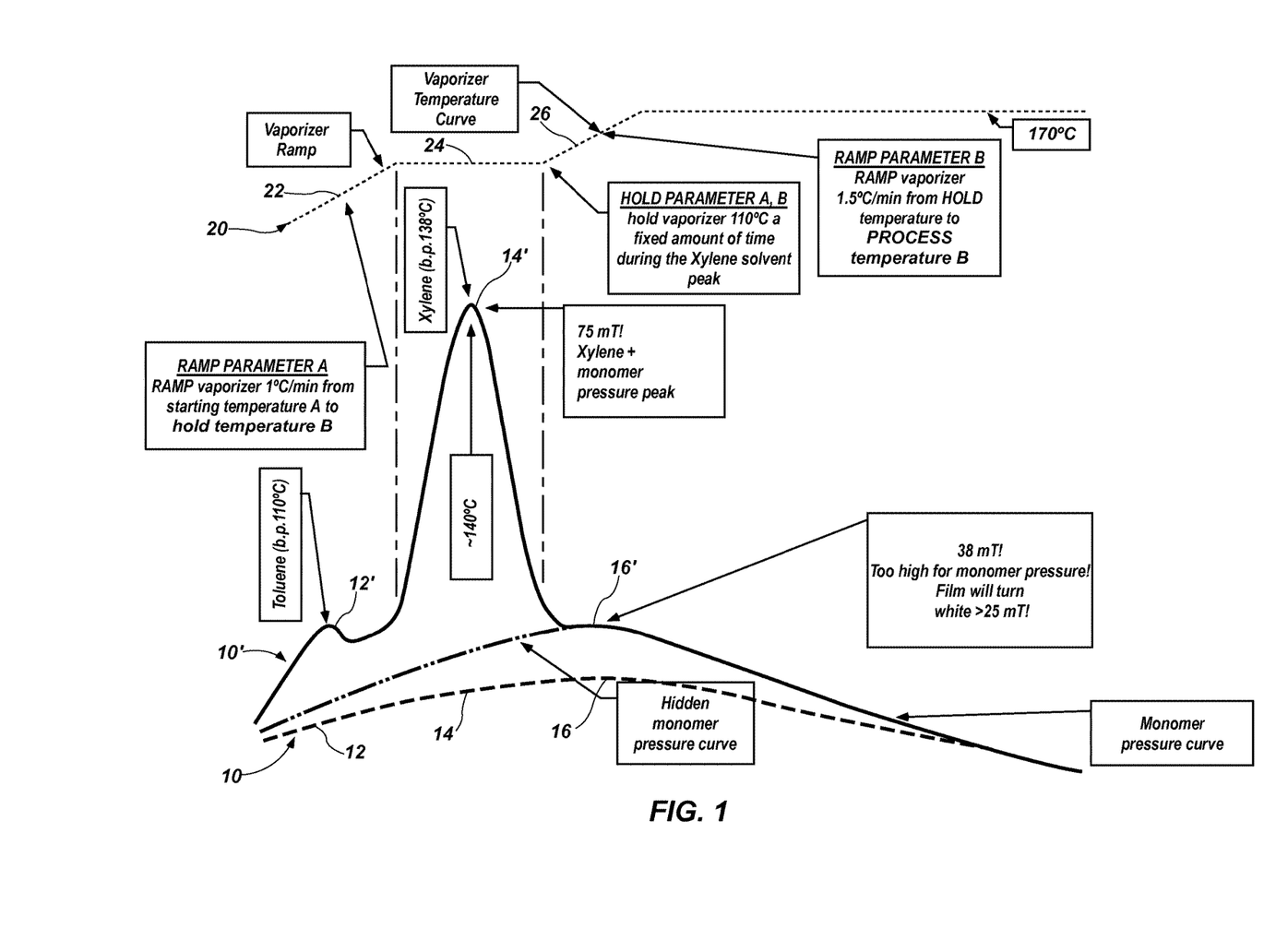
FIG. 1 illustrates an embodiment of a vaporization profile that may be used while processing the precursor material to form a polymer and, optionally, a film formed from the polymer.

FIG. 1 is a pressure profile curve for an embodiment of a batch of precursor material. More specifically, the pressure profile curve of FIG. 1 represents a pressure profile for monomers, or reactive species, that are formed as a poly(p-xylylene) precursor, such as an unsubstituted or substituted [2.2]paracyclophane, is processed (e.g., vaporized and pyrolyzed, etc.). Even more specifically, FIG. 1 depicts corresponding two pressure profile curves: (1) a standard pressure curve 10 based on the contribution of monomers to the overall pressure within at least a portion of a material deposition apparatus (e.g., the deposition chamber thereof, etc.) when the precursor material is processed; and (2) a batch-specific pressure curve 10' that corresponds to the overall pressure within at least one corresponding portion of the material deposition apparatus when a particular batch of a precursor material of the same type as the standard precursor material is processed.

The standard pressure curve 10 corresponds to the pressure that would result from processing a precursor material that lacks constituents that would vaporize at temperatures lower than or equal to the temperature at which the precursor material itself vaporizes. Such a precursor material may be referred to herein as a "standard precursor material." In embodiments where the precursor material comprises a precursor to a poly(p-xylylene), the standard precursor material may substantially lack any volatile constituents, such as additives and solvents (e.g., toluene and/or xylene, etc.), or impurities. As used herein, the phrase "substantially lack" indicates that a precursor material may lack amounts of volatile materials or other impurities that might have an effect on a pressure profile for the precursor material itself.

The batch-specific pressure curve 10' corresponds to a pressure that results from processing a batch of precursor material that varies from the standard precursor material. In the embodiment depicted by FIG. 1, the batch-specific vaporization curve 10' represents a batch of the precursor material that includes sufficient amounts of toluene and xylene to have an effect on the pressure profile for the precursor material itself.

Notably, portions at the left and right sides of the standard vaporization curve 10 and the batch-specific vaporization curve 10' coincide. The divergent portions of the standard vaporization curve 10 and the batch-specific vaporization curve 10' are caused by differences between the standard precursor material and the batch of the precursor material. In embodiments where the precursor material comprises a [2.2]paracyclophane or another precursor to a poly(p-xylylene), a batch of the precursor material may include residual toluene and xylene, which are solvents and may also be considered to be impurities in the precursor material. Because toluene and xylene are both volatile materials with boiling points (i.e., 110° C. and 138 C, respectively) that are less than the vaporization temperature of the [2.2]paracyclophane (i.e., about 170° C.), the presence of each of these materials in the precursor material may increase pressure as the temperature of a vaporization component of a material deposition apparatus or another embodiment of material processing apparatus is ramped up to a temperature that will vaporize the precursor material. The increases in pressure caused by toluene and xylene are represented along the batch-specific pressure curve 10'. In particular, the batch-specific pressure curve 10' includes a toluene vaporization peak 12' that corresponds to a location 12 on the standard pressure curve 10 that lacks a peak, as well as a xylene vaporization peak 14' that corresponds to a location 14 on the standard pressure curve 10 that lacks a peak.

At a location 16' to the right of the xylene vaporization peak 14', the batch-specific pressure curve 10' indicates that reactive species formed from the batch of precursor material are still subjected to a higher pressure than the pressure to which reactive species from a standard precursor material would be subjected at the same point 16 in the process. This difference in pressure is a residual effect of the xylene pressure peak 14', and may have a significant effect on the polymer that is formed and/or on a film that comprises the polymer.

In view of the potential effects of the quality of a batch of a precursor material (e.g., various solvents in the batch of the precursor material, other impurities or other constituents of the batch of the precursor material, additives to the precursor material, etc.) on the manner in which the precursor material may be processed, and on the quality of a polymer and film formed by processing the precursor material, an understanding of the quality of the batch of the precursor material prior to processing may be useful for predicting how precursor material from the batch might affect processing, as well as the quality of a polymer formed from the precursor material. Accordingly, the quality of a sample from a batch of a precursor material may be analyzed, and information obtained from that analysis may be used to generate a process that is tailored to the batch of precursor material.

Figure 2:
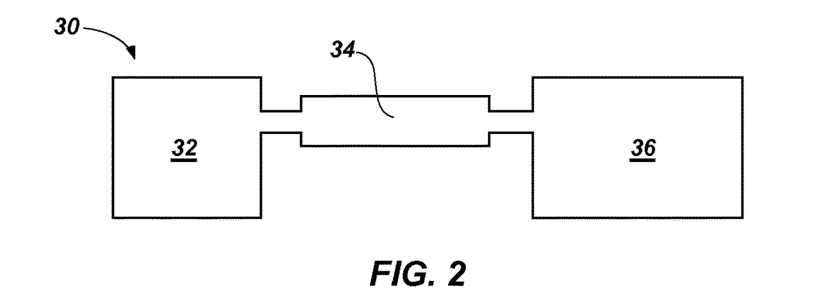
FIG. 2 depicts an embodiment of an analyzer for determining a quality of a sample of a batch of a precursor material.

FIG. 2 illustrates an embodiment of an analyzer 30 for determining a quality of a sample from a batch of a precursor material. In various embodiments, the analyzer 30 may be configured to obtain and provide information about the quality of a sample. Without limitation, the analyzer 30 may comprise a chemical analyzer (e.g., a mass spectrometer, etc.) configured to determine various constituents of the sample, including the precursor material itself, any residual solvents in the precursor material, other impurities in the precursor material, additives to the precursor material and the like. Additionally, such an analyzer 30 may be configured to determine relative amounts of the precursor material and one or more other constituents of the sample.

In other embodiments, the analyzer 30 may comprise a miniaturized, or small-scale, material processing apparatus configured to determine the quality of a sample from a batch of precursor material by processing the sample in a parallel manner to that effected by (e.g., the same manner as, recreate processing conditions of, etc.) a commercial material processing apparatus. As an example, in embodiments where the precursor material comprises a poly-p-xylylene) precursor, such as an unsubstituted or substituted [2.2]paracyclophane, the miniaturized material processing apparatus, or the analyzer 30, may comprise a vacuum deposition apparatus with a vaporization element 32, a pyrolysis tube 34 and a deposition chamber 36.

In any event, a miniaturized material processing apparatus may be configured to process a sample from a batch of a precursor material, and to enable analysis of the manner in which the sample responds to process parameters (e.g., a standardized process; a batch-specific, or tailored, process; etc.). The results of such processing may provide a profile for the batch of precursor material, which may include information about one or more specific characteristics of the batch of precursor material. Various embodiments of specific characteristics of the batch that may be determined include, but are not limited to, the presence of one or more impurities (e.g., the presence of certain constituents, such as water, solvents (e.g., xylene, toluene, etc.), other impurities (e.g., other types of precursor material, such as Parylene N or Parylene D in a Parylene C precursor, etc.), additives, etc., in the batch of precursor material; the relative amounts of constituents of the batch of precursor material; etc.) or process information about the batch of precursor material (e.g., pressure spikes caused by the batch of precursor material; and the density of the batch of precursor material (e.g., pellet vs. powder, etc.). This information may be associated with other information on the batch of precursor material, including, without limitation, the type of precursor material (e.g., Parylene C, Parylene N, Parylene D, Parylene AF, etc.), the identity of the manufacturer of the batch of precursor material, the manufacturer's batch number for the batch of precursor material and/or the supplier's batch number for the batch of precursor material. This information may also be used in combination with other information (e.g., the quantity of precursor material; characteristics of the manner in which the precursor material is packaged (e.g., the shape and dimensions of the boat; the thermal mass and/or thermal conductivity of the boat; dimensions and/or thermal characteristics of any volatilization aids, such as hexagonal shaped cells, within in the boat; etc.) to generate a process profile that is specific to the batch of precursor material, and that may be tailored to cause a larger scale material processing apparatus to process precursor material from the batch in a manner that will provide a polymer and/or film of standard quality. Accordingly, the miniaturized material processing apparatus may be referred to as a "calibration apparatus."

Because the precursor material may be pre-analyzed by a "calibration apparatus" in the same manner as precursor material from the same batch would be processed by a commercial scale material processing apparatus, the use of a calibration apparatus may account for entrapped solvents, the presence of contaminants, as well as other variables, such as the thermal conductivity of the precursor material, the volatilization rate of the precursor material, the form of the precursor material (e.g., powdered form, or pellet form, etc.), the extent to which the precursor material is packed (e.g., loosely, densely, etc.), etc. In some embodiments, the calibration apparatus may also be used to determine the effects of the manner in which the precursor material is packaged (e.g., the shape and thermal characteristics of a boat and any volatilization aids therein, etc.) on the manner in which the precursor material will be vaporized or sublimated. This information may also be determined for a variety of quantities of the precursor material. Accordingly, a calibration apparatus may be used to determine the actual performance of a batch of precursor material before precursor material from the batch is deposited in bulk (e.g., onto a plurality of electronic device assemblies, etc.).

In some embodiments, the data obtained by using the analyzer 30 may facilitate the accurate generation of a process profile that may be used to enable a larger-scale material processing apparatus to process precursor material from the same batch in a manner that will provide a polymer and/or film of standard quality. In other embodiments, including those where the analyzer 30 comprises a miniature material processing apparatus, one or more additional samples may be processed by the analyzer 30 to enable tuning of the manner in which precursor material from that batch is to be processed and, thus, to provide a tailored process profile for that batch of precursor material.

Once data has been obtained that will enable generation of a process profile for a batch of precursor material, or once the process profile has itself been generated, that data may be stored. In some embodiments, the data may be stored on a tag 48 (FIG. 3) that is to be packaged with quantities of precursor material 42 from that batch. Alternatively, the data may be stored on a server, and the tag 48 may store information that serves as an index that enables the data to be accessed from the server. In some embodiments, software may be used to capture the data and, optionally, to generate additional data regarding a profile (e.g., a quality profile, a purity profile, a process profile, etc.) for the batch of precursor material. The tag 48 may be configured to remotely communicate the data to a complementary reader 54 (FIG. 4) associated with a material processing apparatus 50 (FIG. 4).

In a specific embodiment, the tag 48 (FIG. 3) may comprise a radiofrequency identification (RFID) tag or another suitable near field communication element. The data may be stored on the near field communication element in a manner known in the art.

In another embodiment, the tag 48 (FIG. 3) may comprise an optically scannable element. A non-limiting example of an optically scannable element is a barcode, which may comprise any suitable configuration of barcode, including, without limitation, a one-dimensional barcode (which includes a series of parallel lines) or a two-dimensional barcode (which includes so-called "matrix barcodes," e.g., QR codes, etc.). An output element may generate a physical representation of the optically scannable element. In various embodiments, the output element may define the optically scannable element on a substrate. Without limitation, the output element print the optically scannable element onto a label, print the optically scannable element directly onto a substrate by which the optically scannable element is to be carried (e.g., a boat, a removable lid for a boat, etc.) or etch the optically scannable element into the substrate (e.g., by laser ablation, etc.).

Figure 3:
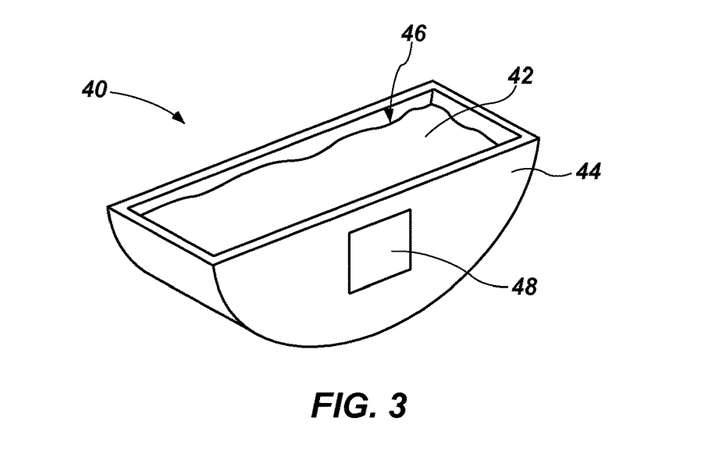
FIG. 3 schematically depicts a packaged precursor material, in which the precursor material is carried by a reservoir of a boat, and the boat also carries a tag that carries data corresponding to one or more characteristics of the precursor material within the boat.
Figure 4:
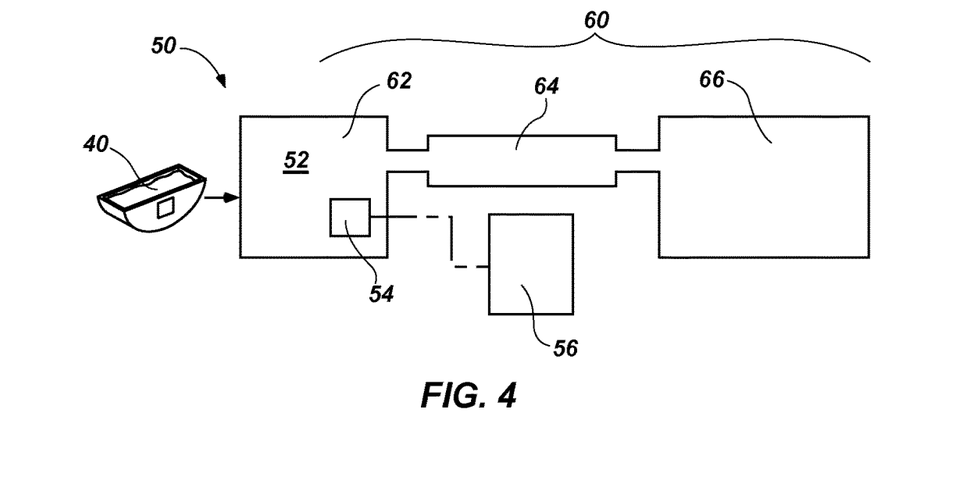
FIG. 4 provides a schematic representation of a material processing apparatus that is configured to receive a precursor material that has been packaged in a manner such as that depicted by FIG. 2 and to process the precursor material in a manner that accommodates the at least one characteristic while providing a polymer and/or film of standard quality.

Turning now to FIG. 3, an embodiment of a packaged precursor material 40 comprises a quantity of a precursor material 42 and a tag 48. The tag 48 carries data regarding one or more characteristics (e.g., a quality, purity, a specific characteristic, a process profile, etc.) of a batch from which the precursor material 42 was obtained. In some embodiments, the precursor material 42 may be carried by a boat 44 or another carrier. More specifically, the precursor material 42 may be carried within a reservoir 46 of the boat 44 or other carrier. In embodiments where the precursor material 42 is carried by a boat 44 or another carrier, the tag 48 may also be carried by (e.g., it may be affixed to, engaged by, etc.) the boat 44 or other carrier. Alternatively, the tag 48 may be placed within the reservoir 46 of a boat 44, along with the precursor material 42.

As illustrated by FIG. 4, a packaged precursor material 40, such as that depicted by FIG. 3, may be configured for introduction into a receptacle 52 of a material deposition apparatus 50. In addition to the receptacle 52, the material deposition apparatus 50 may include a reader 54, a data processing element 56 and a material processing component 60.

The reader 54, which is associated with the receptacle 52, may be configured to obtain data carried by a tag 48 that is associated with the boat 44 (FIG. 3) of the packaged precursor material 40 (FIG. 3). The data carried by the tag 48 corresponds to the precursor material 42 (FIG. 3) of the packaged precursor material 40 or, more specifically, to a batch of precursor material from which the precursor material 42 was obtained. The reader 54 may also be configured to communicate the data from the tag 48 to the data processing element 56 of the material processing apparatus 50. In some embodiments, the reader 54 may generate a signal that carries the data.

In embodiments where the tag 48 comprises an RFID tag, the reader 54 may comprise an RFID reader of a known type, and which is compatible with the RFID tag. In embodiments where the tag 48 comprises a barcode, the reader 54 may comprise a barcode reader, or a barcode scanner, of a known type, and which is compatible with the barcode. Of course, other types of readers 54 may also be included in a material processing apparatus 50 according to this disclosure, provided that the reader 54 is configured to obtain data from the tag 48 of packaged precursor materials 40 that are to be used with the material processing apparatus 50.

Upon receiving the signal from the reader 54, the data processing element 56 may, under control of one or more programs, process the data. Processing of the data may include obtaining from the signal a predetermined process profile (e.g., a vaporization profile or sublimation profile, etc., that was determined during calibration of the batch of precursor material) for the precursor material 42 (FIG. 3). Alternatively, the data processing element 56 may process data that corresponds to one or more characteristics of a batch of precursor material, as obtained during calibration of that batch or precursor material, from the signal and use that data in conjunction with any optional information on the manner in which the batch of precursor material has been packaged to generate a process profile for the precursor material 42. In some embodiments, the process profile may be generated based on a standard process profile for a standard precursor material (i.e., for a precursor material of standard purity, for a precursor material with a standard amount of one or more impurities, for a precursor material with a standard amount of one or more solvents, etc.). In other embodiments, the data processing element 56 may generate the process profile by inputting the data into an algorithm.

The material processing component 60 of the material processing apparatus 50 may be configured to operate under control of the data processing element 56 and, thus, process a quantity of precursor material 42 (FIG. 1) in accordance with a process profile received, modified or generated by the data processing element 56. As an alternative to automatic operation of the material processing component 60 of the material processing apparatus 50, the data processing element 56 may then output recommendations to an operator of the material processing apparatus 50.

Without limitation, the material processing component 60 may be configured to process a precursor material 42 that comprises a poly(p-xylylene) precursor, such as an unsubstituted or substituted [2.2]paracyclophane. Such a material processing component 60 may include, among other elements, a vaporizer 62, a pyrolyzer 64 and a deposition chamber 66, as known in the art. Operation of the vaporizer 62 and the pyrolyzer 64 may be controlled by the data processing element 56.

With continued reference to FIG. 4, as well as returned reference to FIG. 1, an embodiment of the manner in which a process profile may be executed by a data processing element 56 of a material processing system 50 to control the manner in which a material processing component 60 of the material processing system 50 processes a precursor material 42 (FIG. 3) is shown and described. The process profile is represented in FIG. 1 as a temperature curve 20.

When a quantity of precursor material 42 (FIG. 3) is first introduced into the receptacle 52 of the material processing apparatus 50, which receptacle 52, in this embodiment, communicates with a vaporizer 62, the vaporizer 62 may be operated in a manner that initiates heating of the precursor material 42. The rate at which the vaporizer 62 ramps the temperature of the precursor material 42 depends, at least in part, on the amounts of one or more constituents (e.g., any residual solvents in the precursor material, other impurities in the precursor material, additives to the precursor material, etc.) in the precursor material 42, and on the effect of each constituent on the pressure within the vaporizer 62, the pyrolyzer 64 and the deposition chamber 66. Accordingly, when the amount of a constituent of the precursor material 42 will not have a significant effect on pressure, the rate at which the vaporizer 62 increases the temperature of the precursor material 42 may remain the same or substantially the same. In FIG. 1, this is illustrated by a portion 22 of the temperature curve 20 that corresponds to the toluene vaporization peak 12' of the batch-specific pressure curve 10', which indicates that the precursor material 42 does not include toluene in an amount significant enough to have an undesirable effect on the pressure that is generated during vaporization. Thus, the rate at which the temperature is ramped upward may remain unmodified relative to a corresponding temperature ramp of a standard temperature curve that may be used when a standard precursor material is processed.

In the depicted embodiment, the amount of another constituent (e.g., xylene, etc.) present in the precursor material 42 (FIG. 3) to which the process profile and the temperature curve 20 correspond may, when processed, increase pressure to an extent that may have an undesirable effect on a polymer and/or a film that may be formed and/or deposited by the process. Accordingly, as the temperature of the precursor material 42 (FIG. 3) approaches the initial temperature associated with a vaporization peak that corresponds to that constituent (e.g., a xylene vaporization peak 14'—a temperature of about 110° C., etc.), the rate at which the vaporizer 62 ramps the temperature upward may be decreased or the temperature may be held substantially steady, as represented by a horizontal segment 24 of the temperature curve 20. The duration of time for which the vaporizer 62 holds the temperature of the precursor material 42 substantially steady or increases the temperature of the precursor material 42 at an otherwise reduced rate may depend upon the amount of the constituent in the precursor material 42, and may not be re-increased to normal until a sufficient amount of the constituent has been removed from the precursor material 42 to enable the precursor material 42 to be vaporized at an acceptable pressure.

Once a potentially problematic constituent has been sufficiently vaporized, the vaporizer 62 may increase the rate at which the temperature of the precursor material 42 is ramped upward, as represented by segment 26 of the temperature curve 20. Once all of the constituents that may undesirably increase pressure have been removed from the precursor material 42, the vaporizer 62 may heat the precursor material to its vaporization temperature without having an undesirable effect on the pressure within the pyrolyzer 64 or the deposition chamber 66.

By way of contrast, if the precursor material 42 was subjected to a standard process used for a standard precursor material, which may include subjecting the precursor material 42 to a temperature that increases at a substantially constant rate until it reaches the vaporization temperature, any pressure spikes caused by volatile constituents (e.g., the toluene vaporization peak 14', etc.) may undesirably increase pressure within the vaporizer 62 (e.g., to 75 mT), which could also undesirably increase pressure within the pyrolyzer 64 and the deposition chamber 66. Such an increase in pressure may have a lasting effect on the pressure within the material processing component 60. For example, even after the volatile constituent is vaporized, the pressure within the pyrolyzer 64 and/or the deposition chamber 66 may remain undesirably high (e.g., at 38 mT at location 16' of the batch-specific vaporization curve 10', etc.), which may have an undesirable effect on the polymer and/or film formed by the process (e.g., it may result in a white film, as typically occurs when the pressure of the reactive species that polymerize to form a poly(p-xylylene) are subjected to a pressure of greater than 25 mT, etc.).

When the disclosed techniques are used, process parameters may be adjusted to compensate for differences between a precursor material 42 (FIG. 3) that is introduced into a material processing apparatus 50 and a standard precursor material for which a standard process to be performed by the material processing apparatus 50 has been developed. More specifically, the standard process may be adjusted to compensate for a profile of a precursor material 42 that is introduced into the receptacle 52 of the material processing apparatus 50. The standard process may also be adjusted to compensate for variations in the type of precursor material 42 used (e.g., use of Parylene N, Parylene D, more exotic materials like Parylene AF, mixtures of different types of Parylene, etc., instead of Parylene C; etc.), regardless of whether or not an operator of the material processing apparatus 50 has any knowledge of the type of precursor material 42 he or she is introducing into the material processing apparatus 50. Accordingly, the time and effort needed to tune a material processing apparatus 50 when switching between batches of precursor material 42 and/or between precursor materials 42 from different sources may be reduced or eliminated. Moreover, the disclosed subject matter may reduce the amount of time that is needed to install a material processing apparatus 50 and to prepare the material processing apparatus 50 for use. Furthermore, the disclosed subject matter may reduce the probability of faulty material processing, as well as the losses (e.g., in time, materials, substrates, etc.) associated with faulty material processing.

Although the preceding disclosure provides many specifics, these should not be construed as limiting the scope of any of the ensuing claims. Other embodiments may be devised which do not depart from the scopes of the claims. Features from different embodiments may be employed in combination. The scope of each claim is, therefore, indicated and limited only by its plain language and the full scope of available legal equivalents to its elements.

What is claimed:

1. A method for packaging a precursor material for use in a material deposition process, comprising:
    analyzing at least one characteristic of a sample of a batch of the precursor material;
    based on the at least one characteristic, determining a profile of the batch of the precursor material;
    storing the profile on a tag;
    packaging a portion of the batch of the precursor material with a boat configured for introduction into a material processing apparatus; and
    associating the tag with the boat.

2. The method of claim 1, wherein determining the profile comprises:
    determining a purity profile of the batch of the precursor material; and/or
    determining a vaporization profile of the batch of the precursor material.

3. The method of claim 1, wherein analyzing the at least one characteristic includes analyzing an amount of at least one solvent in the sample of the batch of the precursor material.

4. The method of claim 1, wherein analyzing the at least one characteristic includes analyzing an amount of at least one impurity in the sample of the batch of the precursor material.

5. The method of claim 1, wherein analyzing the at least one characteristic includes analyzing a purity of the precursor material in the sample of the batch of the precursor material.

6. The method of claim 1, wherein determining the profile comprises accounting for at least one spike in pressure associated with a boiling point of at least one solvent in the batch of the precursor material.

7. The method of claim 1, wherein determining the profile of the batch of the precursor material comprises processing the sample of the batch of the precursor material in a calibration apparatus configured to process the precursor material in accordance with a standardized process.

8. The method of claim 7, wherein determining the profile of the batch of the precursor material comprises identifying variations from expected results of processing the precursor material in accordance with the standardized process.

9. The method of claim 8, wherein identifying variations from expected results includes identifying variations between an actual pressure profile of the sample of the batch of the precursor material and a standard pressure profile for the precursor material.

10. The method of claim 8, wherein identifying variations from expected results includes identifying variations between an actual characteristic of a film deposited by the calibration apparatus and a corresponding standard characteristic of a film deposited using the precursor material.

11. The method of claim 1, wherein storing the profile on the tag comprises storing the profile on a radiofrequency identification (RFID) tag or on an optically scannable element.

12. The method of claim 1, wherein associating the tag with the boat comprises securing the tag to the boat.

13. The method of claim 1, wherein storing the profile on the tag further comprises storing data corresponding to a purity of the batch of the precursor material.

14. The method of claim 1, wherein storing the profile on the tag further comprises storing data corresponding to a vaporization profile for the batch of the precursor material.

* * * * *